(12) United States Patent
Manassen et al.

(10) Patent No.: US 12,372,345 B2
(45) Date of Patent: Jul. 29, 2025

(54) 3D PROFILOMETRY WITH A LINNIK INTERFEROMETER

(71) Applicant: KLA Corporation, Milpitas, CA (US)

(72) Inventors: Amnon Manassen, Haifa (IL); Yoav Grauer, Haifa (IL); Shlomo Eisenbach, Milpitas, CA (US); Stephen Hiebert, Milpitas, CA (US); Avner Safrani, Misgav (IL); Roel Gronheid, Leuven (BE)

(73) Assignee: KLA Corporation, Milpitas, CA (US)

( * ) Notice: Subject to any disclaimer, the term of this patent is extended or adjusted under 35 U.S.C. 154(b) by 163 days.

(21) Appl. No.: 17/878,415

(22) Filed: Aug. 1, 2022

(65) Prior Publication Data

US 2024/0035810 A1 Feb. 1, 2024

(51) Int. Cl.
*G01B 11/24* (2006.01)
*G01B 11/06* (2006.01)
*G01B 17/06* (2006.01)
*G01N 21/95* (2006.01)

(52) U.S. Cl.
CPC ...... *G01B 11/2441* (2013.01); *G01B 11/0608* (2013.01); *G01B 17/06* (2013.01); *G01N 21/9505* (2013.01)

(58) Field of Classification Search
CPC ............ G01B 11/2441; G01B 11/0608; G01B 9/02029; G01B 9/02031; G01B 9/02063; G01N 21/9501; G01N 21/9505; H01L 22/12; H01L 22/67288
See application file for complete search history.

(56) References Cited

U.S. PATENT DOCUMENTS

| 5,208,451 | A  | * | 5/1993 | Deck ........................ G01B 9/04 250/201.3 |
| 6,734,967 | B1 | * | 5/2004 | Piwonka-Corle .... G01N 21/211 356/369 |
| 7,724,375 | B1 | * | 5/2010 | Novikov ............ G01B 9/02027 356/498 |
| 2005/0060104 | A1 | | 3/2005 | Strader |
| 2013/0016360 | A1 | | 1/2013 | Ensher et al. |
| 2014/0029014 | A1 | | 1/2014 | Nebosis et al. |
| 2018/0059032 | A1 | | 3/2018 | Perrot |

(Continued)

OTHER PUBLICATIONS

Johann Krauter, Wolfgang Osten, "Inspection of hidden MEMS by an infrared low-coherence interferometric microscope," Proc. SPIE 10749, Interferometry XIX, 1074911 (Aug. 18, 2018); https://doi.org/10.1117/12.2319575 (Year: 2018).*

(Continued)

*Primary Examiner* — Kara E. Geisel
*Assistant Examiner* — Jonathon Cook
(74) *Attorney, Agent, or Firm* — Suiter Swantz IP

(57) ABSTRACT

Systems and methods for generating volumetric data are disclosed. Such systems and methods may include scanning a sample at a plurality of focal planes located along a depth direction of the sample. Such systems and methods may include generating, via a detector of a metrology sub-system, a plurality of images of a volumetric field of view of the sample at the plurality of focal planes. Such systems and methods may include aggregating the plurality of images to generate volumetric data of the volumetric field of view of the sample. The metrology sub-system may include a Linnik interferometer.

55 Claims, 11 Drawing Sheets

(56) References Cited

U.S. PATENT DOCUMENTS

2018/0292198 A1\*  10/2018  Manassen .......... G01B 9/02035
2019/0228518 A1\*   7/2019  Manassen ............ G03F 9/7049
2020/0103355 A1\*   4/2020  Smith ..................... H01L 22/20
2020/0240765 A1    7/2020  Manassen et al.
2021/0372784 A1   12/2021  Hill et al.

OTHER PUBLICATIONS

Korean Intellectual Property Office, International Search Report and Written Opinion for International Application No. PCT/US2023/028299, Nov. 3, 2023, 12 pages.

\* cited by examiner

3D PROFILOMETRY WITH A LINNIK INTERFEROMETER

TECHNICAL FIELD

The present disclosure relates generally to interferometric metrology and, more particularly, to interferometric metrology of bonding pad shapes and voids between bonded samples.

BACKGROUND

Ever-increasing demands on the physical density of semiconductor devices have led to a trend of increasingly complex three-dimensional integrated circuit (3D IC) designs. The trend includes optimizing processes for dedicated functionalities (e.g., tailored to certain device types, such as 3D NAND devices, Complementary-Metal-Oxide-Semiconductor Image Sensor (CIS) devices, logic gates such as AND gates, and the like), manufacturing the types of devices on different samples, and then combining the samples to provide a single (3D bonded) structure (e.g., via wafer-to-wafer (W2 W) bonding, die-to-die (D2D) bonding, die-to-wafer (D2 W) bonding, and the like). For example, such combining may be temporary and/or permanent. Further, such combining may be collective and/or direct. For instance, collective may mean collective D2 W (Co-D2 W) bonding of multiple coupled dies in a single placement operation and direct may mean pick-and-place of individual dies sequentially.

One approach to achieving 3D IC designs is to fabricate structures on two separate samples and bond them together with structures (interconnects, devices) near the interface. This technique may facilitate the integration of complex structures since the two samples may be fabricated separately and bonded in a subsequent process. This trend is also driven by a desire to overcome communication bottlenecks between different areas of the samples and between different functionalities by creating dense interconnects between the bonded samples.

However, defects may cause voids between the bonded surfaces. Defects may include, for example, undesired bumps, ridges, foreign particles, and the like. For example, a 1 micron or less particle could cause a void in the tens of microns in size.

Some 3D IC approaches pose strict requirements on the surfaces of the samples to be bonded and require tight bonding specifications to support tight interconnect densities, small features with tight overlay alignment tolerances, and the like. As part of the bonding process, the surfaces to be bonded may have a surface shape that is concave to allow for a void to be temporarily formed between the surfaces. Such a gap may be collapsed until the surfaces are bonded via a bonding process using heat and pressure. Typically, pad shapes are characterized before being bonded by using an atomic force microscope (AFM).

SUMMARY

A metrology system is disclosed, in accordance with one or more embodiments of the present disclosure. In one illustrative embodiment, the metrology system includes a metrology sub-system. In one illustrative embodiment, the metrology sub-system includes a detector configured for multi-pixel imaging. In one illustrative embodiment, the metrology sub-system includes an illumination source configured to generate an illumination beam. In one illustrative embodiment, the metrology sub-system includes a beamsplitter configured to split the illumination beam into a measurement beam propagating in a measurement arm and a reference beam propagating in a reference arm. In one illustrative embodiment, the metrology sub-system includes a measurement objective lens configured to direct the measurement beam to a sample. In one illustrative embodiment, the metrology sub-system includes one or more illumination optics configured to illuminate a volumetric field of view of the sample with the measurement beam through the measurement objective lens. In one illustrative embodiment, the metrology sub-system includes a reference objective lens configured to direct the reference beam to a reference sample. In one illustrative embodiment, the metrology sub-system includes a controller communicatively coupled to a detector. In another illustrative embodiment, the controller includes one or more processors and may include memory. In another illustrative embodiment, the one or more processors are configured execute a set of program instructions stored on the memory. In another illustrative embodiment, the one or more processors are configured to execute program instructions causing the one or more processors to receive a plurality of images from a scan of the sample at a plurality of focal planes located along a depth direction of the sample to generate, via the detector of the metrology sub-system, the plurality of images of the volumetric field of view of the sample at the plurality of focal planes. In another illustrative embodiment, the one or more processors are configured to execute program instructions causing the one or more processors to aggregate the plurality of images to generate volumetric data of the volumetric field of view of the sample.

A method is disclosed, in accordance with one or more embodiments of the present disclosure. In one illustrative embodiment, the method may include, but is not limited to, manufacturing a sample according to a manufacturing process, where a surface shape of the sample includes a concave shape. In one illustrative embodiment, the method may include generating volumetric data of the surface shape of the sample using a metrology sub-system comprising a detector, where the metrology sub-system comprises a Linnik interferometer, where the detector comprises a multi-pixel detector. In one illustrative embodiment, the method may include bonding the surface shape of the sample with a second sample configured to be bonded with the sample. In one illustrative embodiment, the method may include adjusting the manufacturing process based on the volumetric data.

Another method is disclosed, in accordance with one or more embodiments of the present disclosure. In one illustrative embodiment, the method may include, but is not limited to, scanning a sample at a plurality of focal planes located along a depth direction of the sample to generate, via a detector of a metrology sub-system, a plurality of images of a volumetric field of view of the sample at the plurality of focal planes, where the detector comprises a multi-pixel detector. In one illustrative embodiment, the method may include aggregating the plurality of images to generate volumetric data of the volumetric field of view of the sample.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures.

DETAILED DESCRIPTION

Figure 1A:
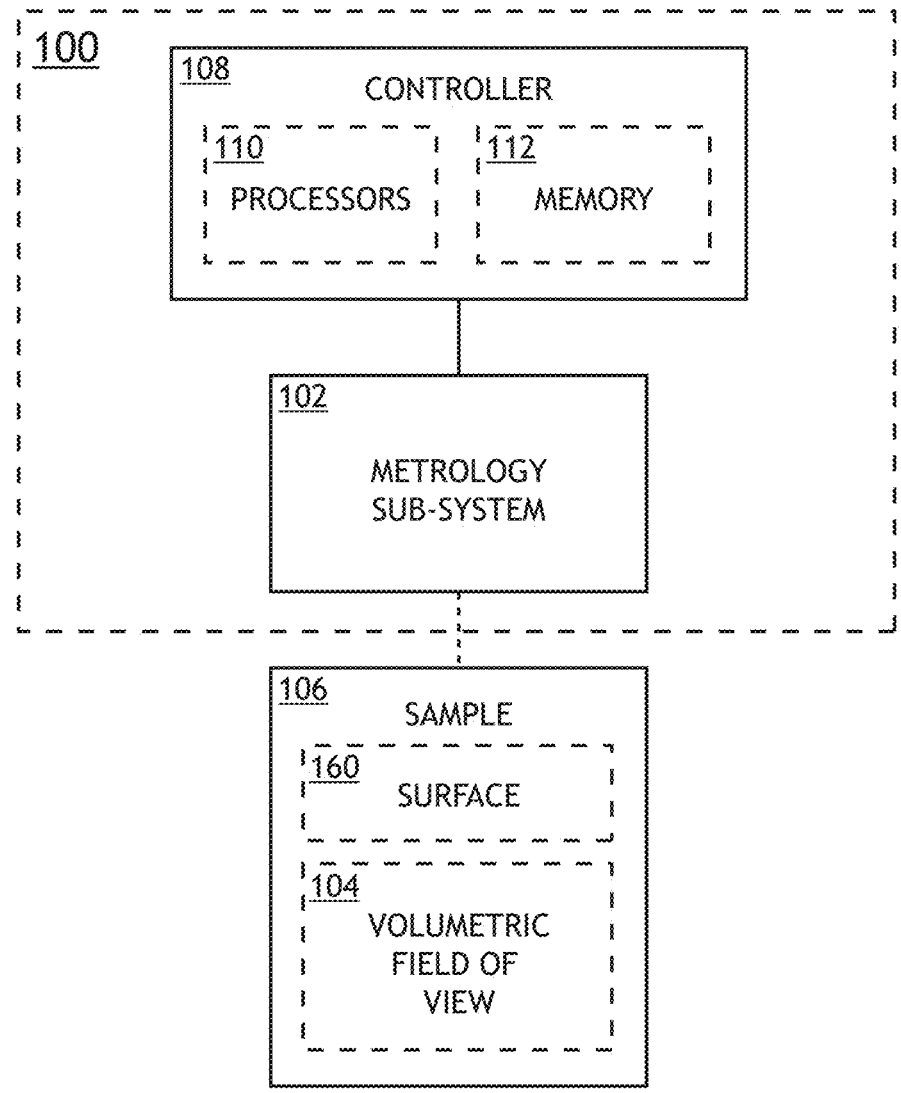
FIG. 1A is a conceptual view illustrating a metrology system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods of using a metrology sub-system (e.g., interferometer, Linnik interferometer, or the like) to identify volumetric field of views including voids at the interface of a bonded sample and/or measure a surface of a pre-bonded sample. Some embodiments of the present disclosure are directed to scanning the interface of a bonded sample by taking multiple images along a depth direction of the bonded sample using a Linnik interferometer adapted for infrared (e.g., but not limited to, short wave infrared (SWIR), near infrared (NIR), and the like) imaging and generating volumetric data based on such images to identify and/or characterize volumetric field of views of the sample. Some embodiments of the present disclosure are directed to using a Linnik interferometer in the visible light spectrum to generate volumetric data of a surface shape of a pre-bonded sample.

One technique for imaging buried volumetric field of views in bonded samples (e.g., wafer-to-wafer (W2W) bonded samples) is to use acoustical microscopy via an acoustical microscope. However, acoustical microscopes may be limited in lateral resolution to about 50 microns or more. Another technique is to use a patterned wafer geometry (PWG) tool, which may also be limited in resolution. The advantages of acoustical microscopy and PWG tools are that such tools may work generally well for inspection of large areas, but may have low sensitivity for individual device features and be impractical for conclusive inspection of such device features. It should also be noted that voids between bonded samples (e.g., caused by surface imperfections, particles/dust, and the like) may be on the order of tens of microns (or less). It is contemplated herein that such voids may—due to decreasing feature sizes and more stringent tolerance requirements of 3D IC—cause issues (e.g., failure of a device/feature of a sample, lack of desired interconnect between bonded samples, the bonded sample to be out of specification/tolerance, and the like). Therefore, it is contemplated herein that acoustical microscopy may be insufficient in resolution to detect volumetric field of views of the sample that may cause such issues.

Metrology based on surface shapes of pre-bonded samples may present challenges. In some processes, a surface shape of a wafer, die, or the like may be in a concave shape to allow for proper bonding. In such a setup, the concave surface of pre-bonded samples may be combined to form a gap with a bond to the surface shape of the sample with a second (different) sample configured to be bonded with the sample. Such a gap may be closed/collapsed due to heat and pressure in a bonding process.

As the trend for increasing densities of devices and interconnects on samples grows, the tolerances for the required surface shape of pre-bonded samples may become more stringent. One technique for measuring the surface shape of a pre-bonded sample is to use atomic force microscopy (AFM). AFM is typically high resolution but is slow compared to other measurement techniques.

Embodiments of the present disclosure may be faster, more efficient, and provide a better resolution-to-speed-of-imaging tradeoff than other techniques (e.g., AFM). For example, even if the resolution of embodiments of the present disclosure are lower than resolutions of an AFM, the tradeoff for having a higher imaging speed and an ability to image at certain resolutions (e.g., resolutions within an acceptable tolerance), may provide for a solution that is preferred. For example, using a Linnik interferometer in the visible light spectrum to image surface shapes of pre-bonded samples may provide one or more benefits compared to previous techniques and provide for a superior tradeoff.

In embodiments, a Linnik interferometer allows for volumetric data generation (e.g., volumetric profilometry capability) to be investigated as fast as, but not necessarily limited to, 300 milliseconds (per volumetric field of view of the sample that is measured). In some examples, volumetric data generation may occur as fast as 10 milliseconds or less per volumetric field of view of the sample that is measured. In some examples, volumetric data generation may be investigated with an accuracy/precision/resolution as low as sub-micron. Such a resolution may be appropriate for measuring pre-bonded surface shapes and/or voids buried at the interface of bonded samples.

Embodiments of the present disclosure are directed to systems and methods for performing metrology on volumetric field of views using a metrology sub-system to scan along a depth direction and generating volumetric data based on images generated from such a scan. It should be noted using an imaging sub-system for taking an image of buried targets of a bonded sample may be disclosed in U.S. patent application Ser. No. 17/069,177, entitled IMAGING SYSTEM FOR BURIED METROLOGY TARGETS, filed on Oct. 13, 2020, (hereinafter referred to as "U.S. patent application Ser. No. 17/069,177"), which is incorporated herein by reference in its entirety.

Benefits of at least some embodiments of the present disclosure may include generation of volumetric data, higher resolution, faster imaging times, and/or the like. Imaging times may be defined as the time to obtain a measurement of each volumetric field of view of the sample including focusing time, time to capture image, alignment time, and the like. For example, imaging times may be imaging times as defined relative to a scanning configuration and/or a Move-Acquire-Measure (MAM) configuration. For instance, a time-delay integration (TDI) detector in a scanning configuration may be used to obtain images used to generate volumetric data and the imaging time may be the time it takes to image multiple points of interests divided by the number of points of interest. For instance, imaging times may, for some embodiments, be hundreds (e.g., 100, 200) of milliseconds per volumetric field of view measured or less (e.g., less than 100 milliseconds). For example, hundreds of milliseconds per surface shape distributed over a 40 micron by 40 micron area of a pre-bonded sample. In some embodiments, resolutions of 5 microns, 3 microns, down to 1 micron; and/or the like may be achieved using the metrology sub-system.

As used throughout the present disclosure, the term "sample" or "substrate" generally refers to a substrate. For example, a substrate may be a substrate formed of a semiconductor or non-semiconductor material. In some examples the substrate is a wafer, die, or the like. For example, a semiconductor or non-semiconductor material may include, but is not limited to, monocrystalline silicon, gallium arsenide, and indium phosphide. A sample may include one or more layers. For example, such layers may include, but are not limited to, a resist (including a photoresist), a dielectric material, a conductive material, and a semiconductive material. Many different types of such layers are known in the art, and the term sample as used herein is intended to encompass a sample on which all types of such layers may be formed. One or more layers formed on a sample may be patterned or unpatterned. For example, a sample may include a plurality of dies, each having repeatable patterned features. Formation and processing of such layers of material may ultimately result in completed devices. Many different types of devices may be formed on a sample, and the term sample as used herein is intended to encompass a sample on which any type of device known in the art is being fabricated. Further, for the purposes of the present disclosure, the term sample and wafer should be interpreted as interchangeable insofar as a sample may be a wafer and a wafer is at least one example of a sample. A die is another example of a sample.

Referring now to FIGS. 1A through 1F, systems and methods for imaging samples 106 and generating volumetric data are described, in accordance with one or more embodiments of the present disclosure. In at least some embodiments, the systems and methods may be used to augment existing systems and methods of metrology (e.g., overlay metrology) and/or inspection of samples.

FIG. 1A illustrates a conceptual view of a metrology system 100, in accordance with one or more embodiments of the present disclosure. In one embodiment, the metrology system 100 includes a metrology sub-system 102 configured to scan at least one volumetric field of view 104 of a sample 106. For example, the metrology sub-system 102 may generate a plurality of field-plane images of a volumetric field of view 104 and/or a plurality of pupil-plane images of the buried volumetric field of view 104. For example, 50 or more images, 80 or more images, and the like may be sufficient to generate adequate volumetric data along a depth direction. In another embodiment, the metrology system 100 includes a metrology sub-system 102 configured to scan at least one surface shape (e.g., of surface 160) of a sample 106. Generally, a volumetric field of view 104 may be and/or include any area, surface, volume, defect, target, void, and/or the like.

In embodiments, the sample 106 may include any type of sample known in the art. For example, the sample 106 may include a bonded sample formed from two substrates bonded together at an interface, where the volumetric field of view 104 is located at or near the interface. Further, the samples may be formed from any material or combination of materials including, but not limited to, a semiconductor, a metal, a polymer, a glass, or a crystalline material. In one embodiment, at least one of the samples includes a wafer (e.g., a semiconductor wafer). For example, a sample 106 may be formed as a bonded wafer sample with two wafers bonded at an interface.

In embodiments, the sample 106 is a die-to-wafer (D2W) bonded sample. For example, the metrology system 100, metrology sub-system 102, and/or interferometer may be configured to be used with die-to-wafer samples (e.g., bonded die-to-wafer samples, pre-bonded dies configured to be bonded to a wafer, and/or the like), according to a metrology recipe.

In embodiments, the sample 106 is a die-to-die (D2D) bonded sample.

In embodiments, the sample 106 is a wafer-to-wafer (W2W) bonded sample.

In embodiments, the sample 106 is a die-to-wafer (D2W) bonded sample.

The metrology sub-system 102 may include any type of metrology sub-system known in the art suitable for generating one or more images of one or more volumetric field of views 104 on a sample 106 at any plane (e.g., focal plane) or combination of planes and measuring one or more parameters of interest associated with the sample 106 based on the one or more images.

In another embodiment, the metrology system 100 includes a controller 108 communicatively coupled to the metrology sub-system 102. In another embodiment, the controller 108 includes one or more processors 110 configured to execute program instructions maintained on a memory 112. The one or more processors 110 of a controller 108 may include any processing element known in the art. In this sense, the one or more processors 110 may include any microprocessor-type device configured to execute algorithms and/or instructions. Further, the memory 112 may include any storage medium known in the art suitable for storing program instructions executable by the associated one or more processors 110. For example, the memory 112 may include a non-transitory memory medium. As an additional example, the memory 112 may include, but is not limited to, a read-only memory (ROM), a random-access memory (RAM), a magnetic or optical memory (e.g., disk), a magnetic tape, a solid-state drive, and the like. It is further noted that the memory 112 may be housed in a common controller housing with the one or more processors 110.

In this regard, the one or more processors 110 of the controller 108 may execute any of the various process steps described throughout the present disclosure. For example, the one or more processors 110 of the controller 108 may receive one or more images of the buried volumetric field of view 104 from a detector 124 and generate one or more metrology measurements for the sample 106 based on the one or more images from the detector 124.

Figure 1B:
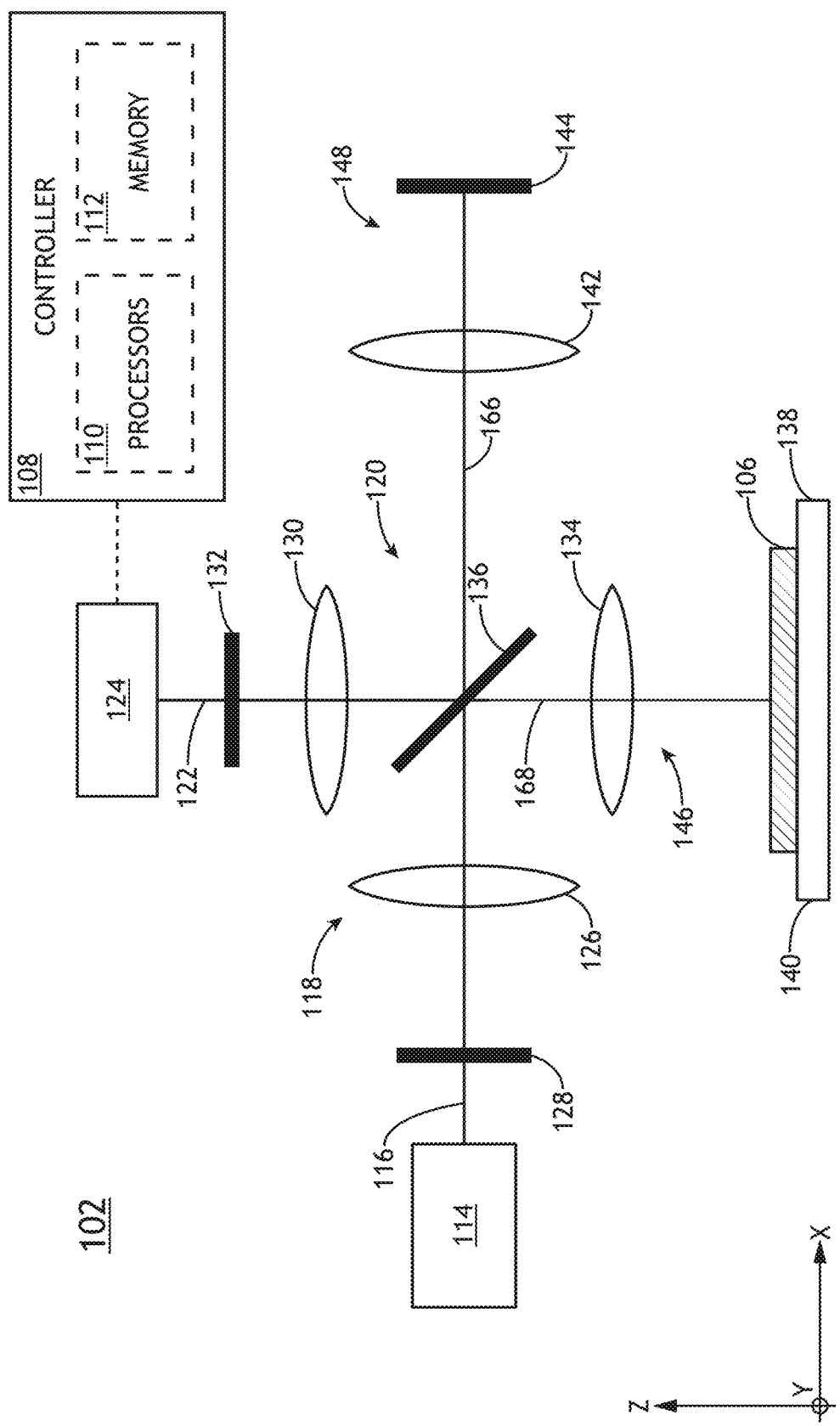
FIG. 1B is a conceptual view of an image-based metrology sub-system, in accordance with one or more embodiments of the present disclosure.

FIG. 1B is a conceptual view of an image-based metrology sub-system 102, in accordance with one or more embodiments of the present disclosure in an interferometric configuration as may be used to generate volumetric data of a sample 106.

In at least some embodiments, FIG. 1B is an example representation of an interferometer including a measurement arm 146 associated with a sample 106 and a reference arm 148 associated with a reference sample 144 to be used as a reference during an interference-based interferometric measurement of the sample 106.

In embodiments, the volumetric data may be generated in a variety of ways such as by scanning the sample 106 along the depth direction. For example, in embodiments, such scanning of the sample 106 may include: moving the sample 106 in a depth direction via a translation stage 140; moving the reference sample 144 via a reference translation stage (not shown) configured to move the reference sample 144; adjusting a phase of the reference beam 166 of the reference arm 148, and/or the like.

In one embodiment, the metrology sub-system 102 includes at least one detector 124 configured to capture at least a portion of detectable light 122 from a collection pathway 120. As used herein, detectable light 122 includes portions of illumination that are directed to the detector 124, including portions of illumination beam 116 and any other illumination from any other illumination source. For example, detectable light 122 may include measurement beam 168 emanating from the sample 106 and reference beam 166 emanating from the reference sample 144. The detectable light 122 may include an interference of the measurement beam 168 with the reference beam 166. Such interference may be imaged by the detector 124 to generate, generally, interferograms, and, in the case of at least some embodiments of the present disclosure, volumetric data.

In one embodiment, the metrology sub-system 102 includes an illumination source 114 configured to generate illumination beam 116. In embodiments, the metrology system 100 includes an illumination pathway 118 (e.g., an illumination sub-system) including one or more components (e.g., illumination lenses 126) to direct the illumination beam 116 to the sample 106.

In another embodiment, the metrology sub-system 102 includes the collection pathway 120 (e.g., an imaging sub-system) including one or more components to collect light from the sample 106. It is noted that "illumination", "light", "beam", "illumination beam", and the like may be interchangeable as used throughout the present disclosure.

In one embodiment, the metrology sub-system 102 includes a reference objective lens 142 configured to receive a portion of the illumination beam 116 through a beamsplitter 136, direct this portion of the illumination beam 116 to a reference sample 144, and collect light reflected from this reference sample 144 (e.g., such reflected light may be called "reference beam 166" of a reference arm 148. In this regard, the measurement objective lens 134 and the sample 106 may form a measurement arm 146 of a Linnik interferometer, and the reference objective lens 142 and the reference sample 144 may form a reference arm 148 of the Linnik interferometer such that interference of the measurement beam 168 from the measurement arm 146 and the reference beam 166 from the reference arm 148 is configured to be imaged by the detector 124.

It is to be understood that the systems and methods disclosed herein may be broadly applicable to a wide range of samples such that the illumination beam 116 may have any selected spectrum based on the composition of the sample 106.

The illumination source 114 may provide illumination beam 116 having any selected wavelength or range of wavelengths. It is contemplated herein that the spectrum of the illumination beam 116 may be selected to transmit through at least a portion of the sample 106 to reach the buried volumetric field of view 104 with minimal or at least acceptable absorption. For example, in the case of a sample 106 formed as two bonded semiconductor substrates, the spectrum of the illumination beam 116 may be selected to include wavelengths in the infrared spectral range. For example, a Linnik interferometer may be adapted for infrared imaging. In another example, in the case of a sample 106 formed as two bonded semiconductor substrates, the spectrum of the illumination beam 116 may be selected to include wavelengths in the short-wave infrared spectral range.

In another example, such as when the volumetric field of view 104 of the sample 106 to be imaged is a pre-bonded surface 160 of a sample 106 (i.e., rather than buried), the spectrum of the illumination beam 116 may be selected to include wavelengths in the visible spectral range. For example, in embodiments, a Linnik interferometer configured for operation in the visible light spectrum range may be used as the metrology sub-system 102.

In embodiments, the metrology sub-system 102 is configured to generate images in multiple wavelengths (e.g., spectral ranges of illumination, channels, and the like) such that the metrology sub-system 102 comprises a multi-wavelength (MWL) metrology sub-system 102. For example, the illumination beam 116 may comprise differing spectral ranges of illumination (i.e., channels) and the beamsplitter 136 may be a wavelength filter beamsplitter such that the beamsplitter 136 is configured to split the illumination beam 116 into two beams of differing spectral ranges of illumination. However, in this context, differing may mean partially differing. For example, for proper functionality in at least some embodiments, there should be at least some overlap in the first and second spectral ranges of light. In this regard, in embodiments, the first spectral range of light is partially overlapping with the second spectral range of light. Such a MWL configuration/technique may allow for improved volumetric data quality (e.g., improved spatial resolution, improved signal to noise ratio (SNR), and the like). For example, the illumination beam 116 may include a illumination spectral range of illumination partially overlapping a second spectral range of illumination such that the metrology sub-system 102 includes a multi-wavelength (MWL) metrology sub-system 102. Further, the beamsplitter (e.g., beamsplitter 136) may include a wavelength filter beamsplitter such that the reference beam 166 includes the first spectral range of illumination and the measurement beam 168 includes the second spectral range of illumination.

In one embodiment, the illumination pathway 118 includes one or more illumination lenses 126 to direct the illumination beam 116 from the illumination source 114 to the sample 106. Additionally, the illumination lenses 126 may be arranged to relay one or more field planes or pupil planes to locations within the illumination pathway 118. The illumination pathway 118 may further include one or more illumination conditioning components 128 suitable for modifying and/or conditioning the illumination beam 116. The illumination conditioning components 128 may be, but are not required to be, located at field planes and/or pupil planes in the illumination pathway 118. For example, the one or more illumination conditioning components 128 may include, but are not limited to, an illumination aperture stop, an illumination field stop, one or more polarizers, one or more compensators, one or more filters, one or more beam splitters, one or more diffusers, one or more homogenizers, one or more apodizers, one or more beam shapers, one or more mirrors, one or more lenses, and/or one or more masks.

For instance, in some embodiments, components such as one or more masks may be configured to selectively block portions of the illumination beam 116 such that a cross sectional intensity profile at a pupil plane of the illumination pathway 118 is an annular shape (i.e., ring-shape) and the illumination beam 116 is an annular illumination beam. Such an annular illumination beam may produce one or more annular measurement beam rings from one or more diffraction orders emanating from the sample 106. One or more similar masks and/or other components may be used to produce similar and/or matching annular profiles for the reference beam 166. Note that, in some embodiments, an annular illumination beam 116 drastically improves/increases the SNR of the measurement beam 168 compared to using a spherical illumination beam. Further, an annular illumination beam 116 may selectively block/reduce undesired specular reflections from a top surface (e.g., backside) of a top sample (e.g., first sample 106a of FIG. 1E), which may further improve the SNR of the measurement beam 168 compared to using a spherical illumination beam. Such improvements may be crucial for imaging. Note that, in some embodiments, the size of an inner diameter (i.e., inner ring diameter) and outer diameter (i.e., outer ring diameter) of an annular illumination beam 116—which may correspond to a maximum numerical aperture value (NAmax) and a minimum numerical aperture value (NAmin), respectively—may be optimized for volumetric data generation. For example, simulated data and/or actual pupil plane image data over a variety of ranges of NAmax and NAmin may be generated at the plurality of focal planes along the depth direction and used to determine/optimize NAmax and NAmin for volumetric data generation. For instance, NAmax and NAmin may be selected such that the SNR is maximized (e.g., specular reflections reduced) for specific applications of volumetric data generation.

In one embodiment, the annular profile of the annular illumination beam 116 may be configured (e.g., via measurement objective lens 134 and/or other components which are not necessarily shown) to be shifted across a pupil plane such that illumination may be provided for from different directions.

In one embodiment, the measurement beam 168 may be decentered (e.g., angled such that the measurement beam 168 is angled relative to (i.e., not parallel to) the depth direction (e.g., Z-direction) of the sample 106. For example, one or more fixed and/or adjustable lenses, reflectors, and the like may be used to set an angle of the measurement beam 168 such that the measurement beam 168 is tilted relative to the sample 106. Further, such a configuration may behave such that a coherence gate of the measurement beam 168 is aligned with the focal planes such that the coherence gate scans along the depth direction at the plurality of focal planes. In addition, such a tilted/angled configuration may allow for improvements such as, but not limited to, more information (e.g., angled volumetric data) and/or increased SNR. For example, surfaces of side walls of features/interconnects that are parallel to the depth direction are generally more easily imaged at an angle rather than from straight above.

In one embodiment, the collection pathway 120 includes one or more collection lenses 130 to direct the detectable light 122 from the sample 106 to the detector 124. In another embodiment, the collection pathway 120 includes one or more collection conditioning components 132 suitable for modifying and/or conditioning the detectable light 122. For example, the one or more collection conditioning components 132 may include, but are not limited to, one or more polarizers, one or more filters, one or more beam splitters, one or more diffusers, one or more apodizers, or one or more beam shapers.

In one embodiment, the metrology sub-system 102 includes a measurement objective lens 134 to direct illumination beam 116 to the sample 106 and/or capture the measurement beam 168 from the sample 106. For example, as illustrated in FIG. 1B, the metrology sub-system 102 may include the beamsplitter 136 common to both the illumination pathway 118 and the collection pathway 120 to allow the measurement objective lens 134 to simultaneously direct the illumination beam 116 to the sample 106 and capture the measurement beam 168 from the sample 106. In another embodiment, though not shown, the illumination pathway 118 and the collection pathway 120 may include separate lenses to direct the illumination beam 116 to the sample 106 and collect the measurement beam 168, respectively.

In embodiments, the illumination beam 116 directed to the sample 106 is larger in cross sectional area (as viewed facing a focal plane) than the field of view of the detector 124. Similarly, in embodiments, the imaged areas of the plurality of images are larger than the cross-sectional area of the volumetric field of view 104. In this regard, the volumetric field of view 104 may be entirely contained within a cross-sectional area of a measurement beam 168 that is directed to the sample 106 such that the volumetric field of view 104 is, in a sense, fully illuminated.

In embodiments, the detector 124 is a multi-pixel detector (e.g., camera, 2D detector, complementary metal-oxide semiconductor (CMOS), and the like). In this regard, the detector 124 may be used to image multiple pixels at once to more efficiently image a volumetric field of view/area and generate volumetric data. In embodiments, detector 124 may be suitable for capturing images of a sample 106 that is stationary or moving. For example, a detector 124 may include, but is not limited to, a photodiode array (PDA), a charge-coupled device (CCD), a CMOS device, a time-delay integration (TDI) detector, a line-scan detector, a photomultiplier tube (PMT), an avalanche photodiode (APD), or the like. In another embodiment, a detector 124 may include a spectroscopic detector suitable for identifying wavelengths of radiation emanating from the sample 106 and dispersed onto a sensor using a dispersive element.

In embodiments, a sample positioning sub-system 138 is utilized to obtain a plurality of images of a volumetric field of view of the sample at different focal planes along a depth direction (e.g., Z-direction) of the sample 106.

In one embodiment, the metrology sub-system 102 includes a sample positioning sub-system 138 configured to adjust the sample 106 and/or the illumination beam 116 prior, during, and/or after a measurement. For example, FIG. 1B illustrates a sample positioning sub-system 138 includes a translation stage 140 to adjust the position of the sample 106 along any dimension such as, but not limited to, a lateral position within the X-Y plane, axially along the Z axis (e.g., an optical axis of the measurement objective lens 134), tip, tilt, or the like. By way of another example, though not shown, the sample positioning sub-system 138 may include one or more scanning optical elements (e.g., galvanometers, rotatable mirrors, or the like) suitable for scanning the illumination beam 116 across the sample 106, or a portion thereof. Similarly, in one embodiment, the metrology sub-system 102 includes a reference translation stage (not shown) configured to adjust the reference sample 144 (shown in FIG. 1C) and/or reference beam 166 (directed to the reference sample 144) prior, during, and/or after a measurement. Embodiments of the sample positioning sub-system 138 which may include focusing capabilities enabled by photodiodes and other components are described in regards to FIG. 1C below.

Figure 1C:
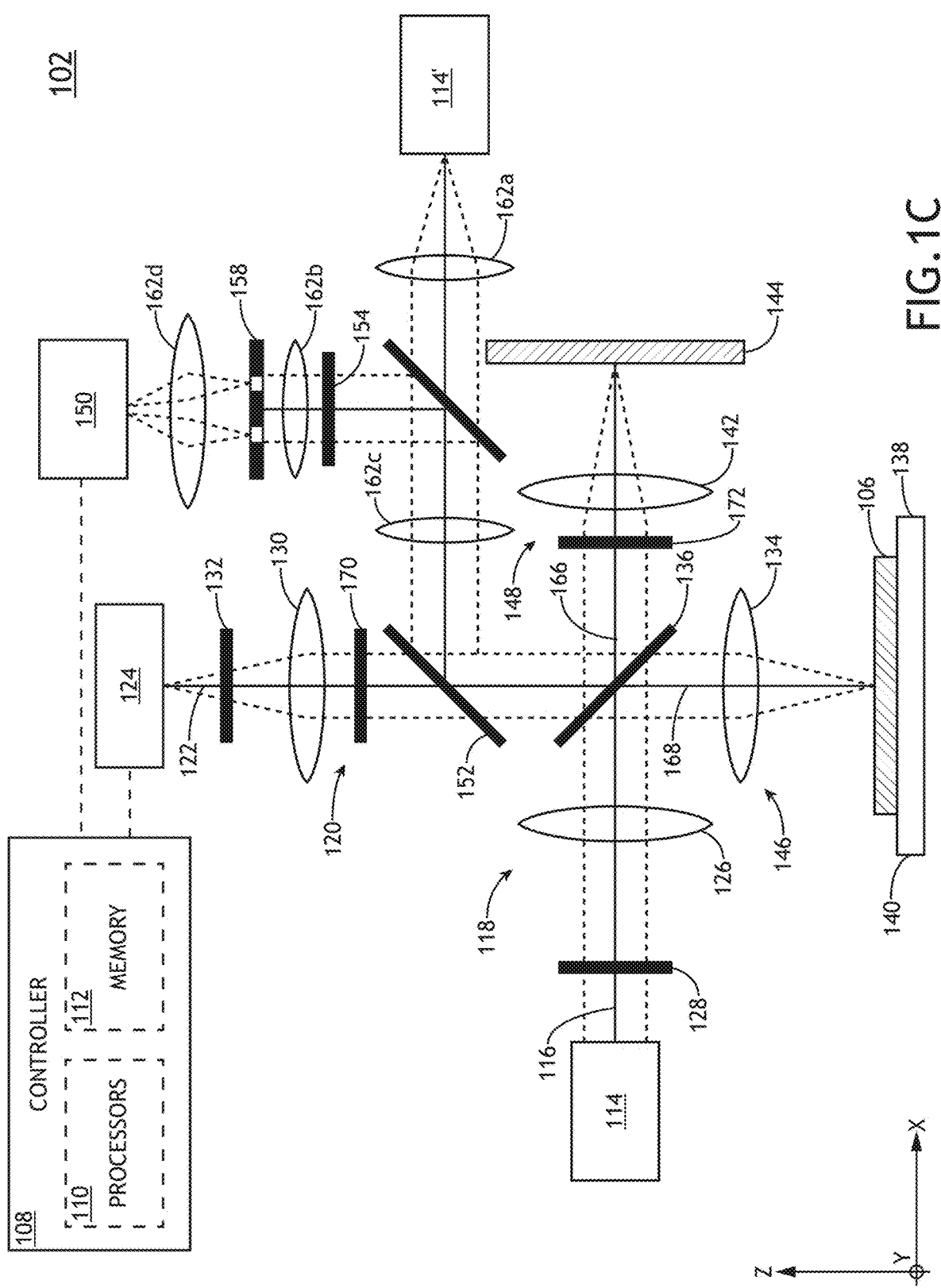
FIG. 1C is a schematic view of a metrology sub-system including a sample positioning sub-system based on a Linnik interferometer, in accordance with one or more embodiments of the present disclosure.

FIG. 1C is a schematic view of a metrology sub-system 102 including a sample positioning sub-system 138 based on a Linnik interferometer, in accordance with one or more embodiments of the present disclosure. It is noted that FIG. 1C includes components (e.g., photodiode 150, second illumination source 114') that, in at least some embodiments, allow for a focusing operation utilizing sample positioning data. The sample positioning data may be utilized to bring the sample 106 into focus.

In one embodiment, the sample positioning sub-system 138 includes one or more components to detect and/or monitor the location of the sample 106, the volumetric field of view 104, the surface 160, or any selected layer within the sample 106 along the optical axis of the measurement objective lens 134. In this regard, the sample positioning sub-system 138 may accurately align the volumetric field of view 104 within the metrology sub-system 102. It is contemplated herein that accurate alignment of the volumetric field of view 104 within the metrology system 100 may provide numerous benefits. For example, accurate alignment of the volumetric field of view 104 may facilitate accurate control of the spatial and angular profile of the illumination beam 116 from the illumination source 114 on the volumetric field of view 104 through the use of tailored illumination field stops and/or pupil stops as discussed throughout the present disclosure. By way of another example, accurate alignment of the volumetric field of view 104 may facilitate accurate alignment of the volumetric field of view 104 with the detector 124 to provide quality images of the selected plane (e.g., the field plane or the pupil plane).

The sample positioning sub-system 138 may detect and/or monitor the axial location of the sample 106 or any portion thereof using a variety of techniques. In one embodiment, the sample positioning sub-system 138 includes a Linnik interferometer to determine and/or monitor a position of the volumetric field of view 104 along the optical axis of the measurement objective lens 134. For example, the Linnik interferometer may be configured to operate with the spectrum of the illumination beam 116 from the illumination source 114 which may be, but is not required to be, narrowband (e.g., having a bandwidth of approximately 5 nm or less). For example, the metrology sub-system 102 may include or be an interferometer, the interferometer including a photodiode 150 configured to be used to focus the detector 124 of the interferometer.

In embodiments, the metrology sub-system 102 includes a modulator 158 configured to modulate the photodiode beam (i.e., light directed to the photodiode 150) (e.g., which may include secondary illumination beam from a second illumination source 114'). For example, the modulator 158 may include (or be) at least one of: a binary phase filter (BPF); a full width, half-maximum (FWHM) filter; or an annular mask. In another example, the modulator 158 includes a BPF FWHM filter and an annular mask. For instance, the modulator 158 may be configured for a bandwidth of 5 nm.

It should be noted that a depth direction may be defined as the Z-direction of FIG. 1C, normal to an upper surface of the sample, substantially normal (e.g., within 20 degrees) to the upper surface of the sample, or the like. Similarly, a focal plane may be normal to the Z-direction of FIG. 1C, normal to the depth direction, parallel to an upper surface of the sample, substantially parallel to the upper surface of the sample, or the like.

In one embodiment, the metrology sub-system 102 includes a photodiode 150 to generate sample positioning data of an interference pattern associated with interference between measurement beam 168 of the measurement arm 146 and reference beam 166 of the reference arm 148 of the Linnik interferometer. In one embodiment, as illustrated in FIG. 1C, the metrology sub-system 102 includes an additional beamsplitter 152 to provide continuous interference images. In another embodiment, the metrology sub-system 102 may include a translatable mirror (e.g., a flip mirror, a mirror on a translation stage 140, or the like) to selectively direct light to the photodiode 150 for the generation of interference images. For instance, the metrology sub-system 102 may direct all light from the beamsplitter 136 to the photodiode 150 when adjusting the position of the sample 106 prior to a measurement to maximize the signal available for focus detection and may then direct all light from the beamsplitter 136 to the detector 124 used for metrology measurements (e.g., capturing one or more sample images) during a measurement.

In one embodiment, the metrology sub-system 102 may include a shutter 172 or other beam deflector to selectively block the light in the reference arm 148 during a metrology measurement. For example, the metrology sub-system 102 may be (or include) a bright field sub-system. For instance, the metrology sub-system 102 may be configured to use bright field imaging techniques in addition to other modes of imaging (e.g., Linnik interferometry mode) to allow for multi-mode imaging.

It is contemplated herein that the illumination requirements for metrology and sample positioning may differ. Accordingly, the metrology sub-system 102 may include any combination of illumination sources and optical elements to provide light having selected properties for both metrology and sample positioning measurements. For example, the metrology sub-system 102 may include a beam diffuser or other components suitable for reducing the spatial coherence of light used for sample positioning to mitigate speckle during the measurement.

In one embodiment, as illustrated in FIG. 1C, the metrology sub-system 102 includes a common illumination source 114 for generating volumetric data and for sample positioning. In this configuration, the metrology sub-system 102 may include one or more optical elements such as, but not limited to, a spectral filter, a spatial filter, a speckle reducer (e.g., a diffuser, or the like), a field stop, a pupil stop, or a polarizer to modify the properties of the illumination beam 116 from the common illumination source 114 for sample positioning measurements. These optical elements may be placed at any suitable location including, but not limited to, the illumination pathway 118 to modify light incident on the sample 106 and/or in the collection pathway 120 to modify light collected from the sample 106.

For example, FIG. 1C illustrates a spectral filter 154 in the collection pathway 120 to modify the spectrum of the illumination beam 116 incident on the photodiode 150 during a sample positioning measurement. For instance, the spectral filter 154 may narrow the bandwidth of the illumination beam 116 used for a sample positioning measurement to a selected bandwidth such as, but not limited to, 10 nm, 5 nm, 2 nm, 1 nm, or any selected bandwidth. In this regard, the illumination beam 116 used during a sample positioning measurement may be monochromatic or quasi monochromatic. It is to be understood that although FIG. 1C illustrates the placement of the spectral filter 154 prior to the photodiode 150, it is to be understood that the spectral filter 154 may be placed at any suitable location including, but not limited to, the illumination pathway 118.

While spectral filters 154 may be useful for focusing, spectral filters may, in at least some embodiments, be critical for imaging itself. In one example, a nonlimiting location of a spectral filter is in the collection pathway before lenses 130, as shown by spectral filter 170. Spectral filter 170 may have the same, similar, or different characteristics compared to spectral filter 154. For example, the spectral filter 170 may be a narrow band spectral filter. In should be noted, in at least some embodiments, a contrast (e.g., SNR) of generated images will be quite poor and thus an axial resolution of such images will be poor without the use of a narrow band spectral filter 170 located before lens 130.

In another embodiment, the metrology sub-system 102 includes a separate illumination source 114' for sample positioning. It should be noted that using a separate illumination source 114' with a photodiode 150 for sample positioning is disclosed generally in U.S. patent application Ser. No. 17/069,177.

For example, as illustrated in FIG. 1C, the separate illumination source 114' for sample positioning may be integrated into the sample positioning sub-system 138. For instance, the sample positioning sub-system 138 may utilize the additional beamsplitter 152 illustrated in FIG. 1C to direct light from the separate illumination source 114' to the sample 106. By way of another example, though not shown, the illumination pathway 118 may include a beamsplitter 136 or other beam selector to provide selective illumination of the sample 106 from any of two or more illumination sources. Generally, a beamsplitter may be configured to split illumination into two or more illuminations/paths going in two or more directions.

It is further contemplated herein that the geometry of a buried volumetric field of view 104 in a sample 106 may provide challenges for typical interferometric sample positioning techniques including, but not limited to, Linnik interferometry. For example, propagation of light through the sample 106 and the reference sample 144 may introduce chromatic dispersion or spherical aberration that may negatively impact the sample positioning measurement.

The metrology sub-system 102 may utilize any spatial or angular profile of light in a sample positioning measurement. In one embodiment, the metrology sub-system 102 provides oblique illumination (e.g., annular illumination, dipole illumination, quadrupole illumination, or the like) for sample positioning measurements. For example, the metrology sub-system 102 may include, but is not required to include, a central obscuration (e.g., numerical apertures) in an illumination pupil of the illumination pathway 118 to generate annular illumination with a selected range of angles on the sample 106 and reference sample 144.

The metrology sub-system 102 may include various other components (e.g., lenses, optics, and the like) to direct/shape illumination, such as components 162a, 162b, 162c, 162d shown in various locations, but not limited to such locations.

Figure 1D:
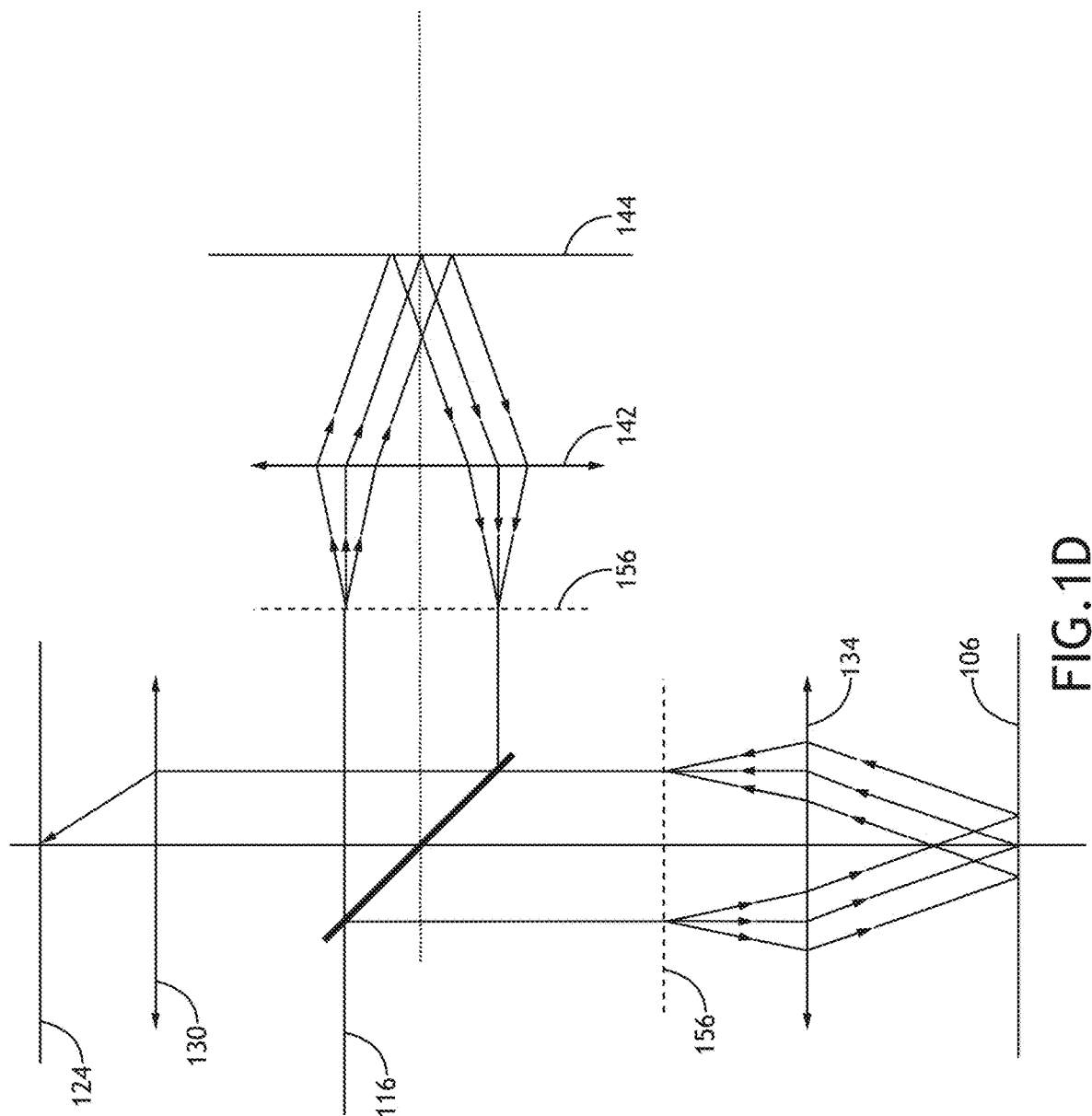
FIG. 1D is a schematic ray diagram illustrating the propagation of oblique illumination through the metrology sub-system in accordance with one or more embodiments of the present disclosure.

FIG. 1D is a schematic ray diagram illustrating the propagation of oblique illumination through the metrology sub-system 102 in accordance with one or more embodiments of the present disclosure. For example, FIG. 1D may illustrate the propagation of illumination beam 116 from a single point along an annular profile. Further, it is to be understood that FIG. 1D is not intended to be a strict ray diagram and that the illustration of three rays from the pupil planes 156 is provided solely for illustrative purposes to indicate illumination beam 116 of the sample 106 and reference sample 144 across a spatial field of view.

It is contemplated herein that oblique illumination, and particularly high-angle or high numerical aperture (NA) illumination, may facilitate sensitive and accurate sample positioning measurements using Linnik interferometry. For example, reflections from a top surface of the sample 106 and the top surface of the reference sample 144 may impact signals associated with reflections from the volumetric field of view 104 of the sample buried in the sample 106. To mitigate this, the illumination beam 116 may be designed to have an annular or other high NA profile during a sample positioning measurement to avoid the collection of specular reflection from the top surfaces of the sample 106 and reference sample 144.

At least some embodiments of the metrology system 100 may be used for a wide variety of applications, of which some nonlimiting examples are shown in FIGS. 1E through 1H. For example, applications may include generating volumetric data of inter-sample voids, pad shapes, through-silicon vias, targets, and the like.

Figure 1E:
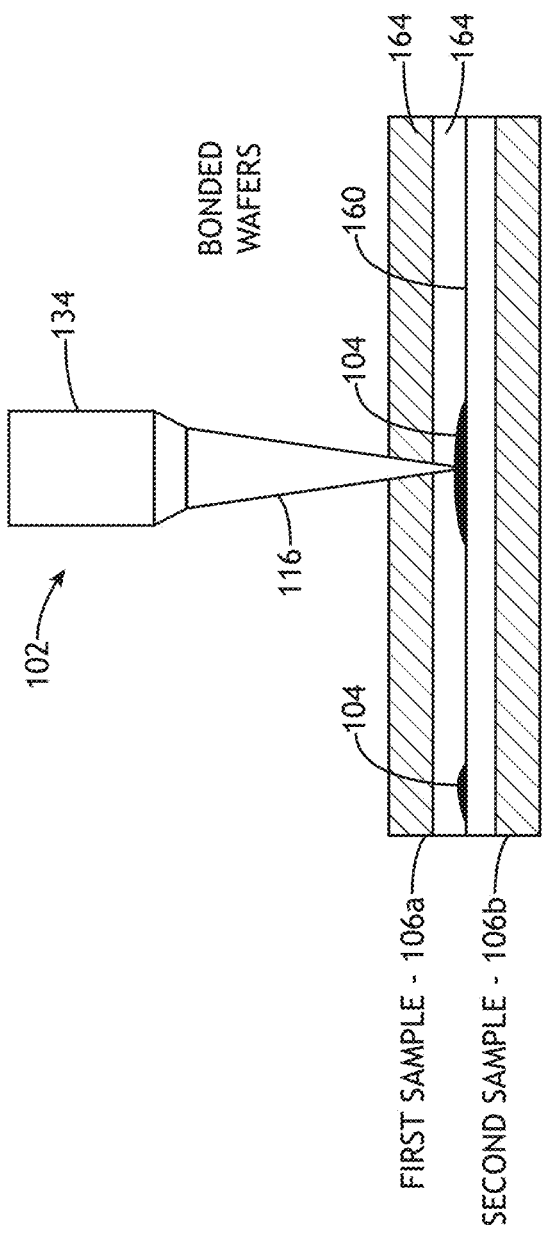
FIG. 1E is a schematic view of a metrology sub-system imaging a void of bonded samples, in accordance with one or more embodiments of the present disclosure.

FIG. 1E is a schematic view of a metrology sub-system 102 having a measurement objective lens 134 and imaging a void 104 of bonded samples 106a, 106b, in accordance with one or more embodiments of the present disclosure. Note that other components of the metrology sub-system 102 are cutaway for simplicity and clarity.

In embodiments, as described throughout, voids 104 may form at the interface between two bonded samples 106a, 106b. Note that, generally, samples 106 may include multiple layers 164 (e.g., 2 layers, 10 layers, hundreds of layers, etc.). The surface 160 of the samples 106 may be mated directly and/or indirectly. Illumination beam 116 is shown penetrating the first sample 106a to image the void 104.

As noted above, when imaging buried volumetric field of views 104 it may be advantageous to use a metrology sub-system 102 configured to image in the infrared spectral range of light and/or the short-wave infrared spectral range of light as such light may provide for improved imaging of buried portions of the sample 106.

Figure 1F:
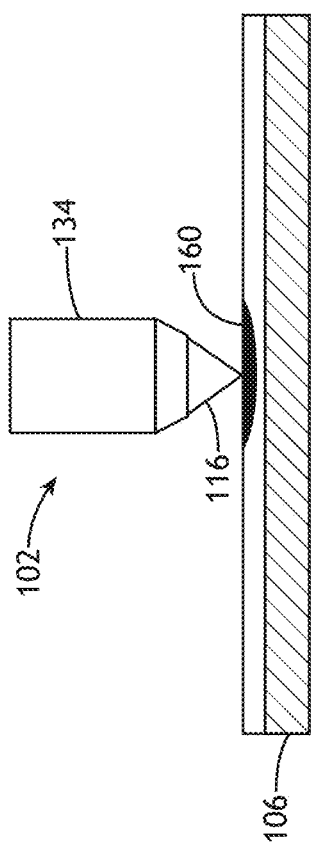
FIG. 1F is a schematic view of a metrology sub-system imaging a pad shape of a pre-bonded sample, in accordance with one or more embodiments of the present disclosure.

FIG. 1F is a schematic view of a metrology sub-system 102 having a measurement objective lens 134 and imaging a surface 160 shape (e.g., a concave shape of a pad surface) of a pre-bonded sample 106, in accordance with one or more embodiments of the present disclosure. Although shown in a flat configuration, note that the surface 160 shape may be in a concave shape relative to the metrology sub-system 102.

As noted above, when imaging surfaces of a sample rather than buried volumetric fields of view it may be advantageous to use a metrology sub-system 102 configured to image in whatever spectral range of light meets other needs since penetrating the sample may not be a concern. For example, the metrology sub-system 102 may be configured to image the surface of the sample 106 in the visible light spectral range or any other spectral range.

Figure 1G:
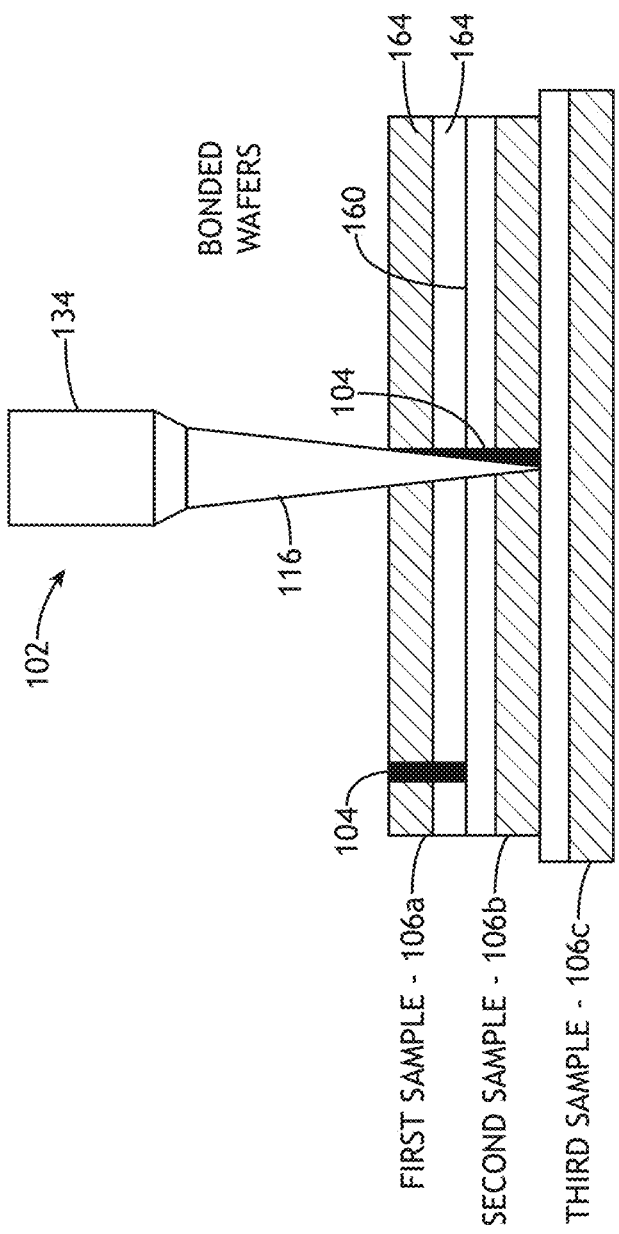
FIG. 1G is a schematic view of a metrology sub-system imaging a through-silicon via (TSV) of bonded samples, in accordance with one or more embodiments of the present disclosure.

FIG. 1G is a schematic view of a metrology sub-system 102 having a measurement objective lens 134 and imaging a through-silicon via (TSV) of bonded samples 106a, 106b, 106c, in accordance with one or more embodiments of the present disclosure. Note that the TSV may be within the volumetric field of view 104. A TSV may be defined as a vertical electrical connection (via) that passes completely through a silicon wafer or die.

Figure 1H:
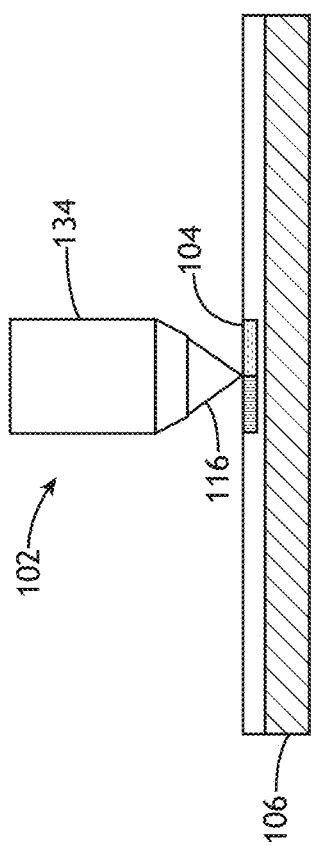
FIG. 1H is a schematic view of a metrology sub-system imaging a target of a sample, in accordance with one or more embodiments of the present disclosure.

FIG. 1H is a schematic view of a metrology sub-system 102 having a measurement objective lens 134 and imaging a target of a sample 106, in accordance with one or more embodiments of the present disclosure. Note that the target may be within the volumetric field of view 104. For example, the target may, but is not limited to, being a target grating (e.g., AIM target) in a scribe line of a wafer. For instance, the target may be an overlay target.

Figure 2:
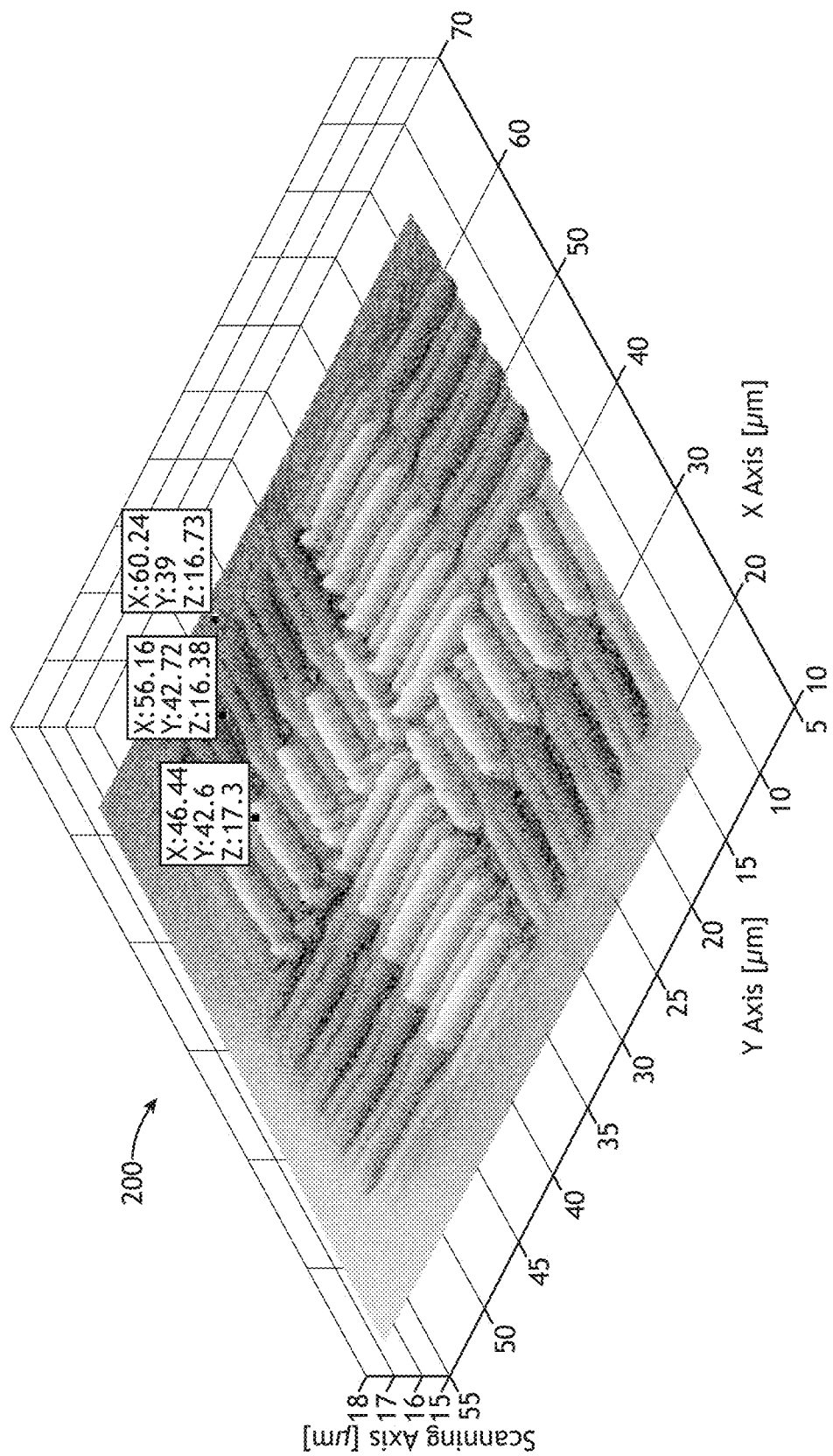
FIG. 2 is a 3D volumetric topology profile of a buried volumetric field of view of a sample reconstructed from interferometry tool data, in accordance with one or more embodiments of the present disclosure.

FIG. 2 is a 3D volumetric topology profile 200 of a buried volumetric field of view 104 of a sample 106 reconstructed from interferometry tool data (e.g., interferogram data, multiple interferogram data, data obtained using an interferogram of the present disclosure, volumetric data, and/or the like), in accordance with one or more embodiments of the present disclosure. Note that while topology profile 200 may show an Advanced Imaging Metrology (AIM) metrology target for illustrative purposes, other portions/elements/areas may be imaged to obtain volumetric data such as, but not limited to, voids 104 located at the interface and/or pre-bonded pad surfaces. For example, volumetric data obtainable using embodiments of the present disclosure may be illustrated similar to the volumetric data illustrated in FIG. 2. In this regard, topology profile 200 shown may be indicative of, but not limiting to, the resolution, roughness/variability, and/or 3-dimensional detail attainable from at least one embodiment of the present disclosure.

Figure 3:
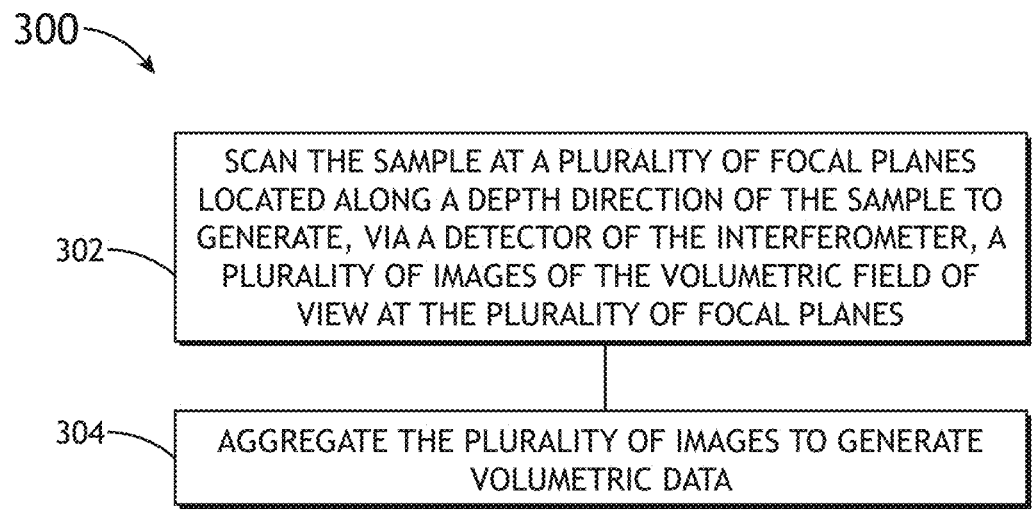
FIG. 3 is a flow diagram illustrating steps performed in a method for generating volumetric data, in accordance with one or more embodiments of the present disclosure.

FIG. 3 is a flow diagram illustrating steps performed in a method 300, in accordance with one or more embodiments of the present disclosure. For example, controller 108 may be configured to be communicatively coupled to the metrology sub-system 102 of the metrology system 100 and may include processors 110 configured to execute program instructions causing the one or more processors 110 to perform the steps of method 300 (and any step, method, or the like of this disclosure).

In a step 302, the sample 106 is scanned at a plurality of focal planes located along a depth direction of the sample 106 to generate, via a detector 124 of the metrology sub-system 102, a plurality of images of the volumetric field of view 104 at the plurality of focal planes.

For example, in embodiments, such scanning of the sample 106 may include: moving the sample 106 in a Z-direction/depth-direction via a translation stage 140; moving the reference sample 144 via a reference translation stage (not shown); adjusting a phase of the reference beam 166 of the reference arm 148, and/or the like.

In a step 304, the plurality of images are aggregated to generate volumetric data of the volumetric field of view 104 of the sample 106. For example, by generating multiple interferogram data for multiple locations (e.g., pixels) common to at least some of the plurality of images. Further, for example, each interferogram data may be an interferogram corresponding to each location and each location may be a pixel. In this regard, an interferogram may be generated for each pixel. The volumetric data may be, but is not required to be, generated based on such multiple interferograms.

In an optional step, the volumetric data may be used to construct a height map of a pre-bonded surface 160 or of a buried volumetric field of view 104 of a sample 106.

In an optional step, the volumetric data may be used to construct a volumetric profile showing different elements in a 3D volume.

In an optional step, one or more voids 104 are identified based on the volumetric data.

In an optional step, a characteristic of one or more voids 104 is determined based on the volumetric data. For example, a characteristic such as a size, thickness, volume, area, width, length, roughness, location, category, and/or any other characteristic may be determined. For instance, a category may be a nuisance or killer category.

It should be noted that the metrology system 100 may include or may couple to a review tool and/or PWG tool. A PWG tool may be an imaging tool (e.g., interferometry based tool, but with a much larger field of view to image entire wafers) configured to image all of (i.e., the entirety of) the sample 106 at once. The review tool may be, for example, an acoustical microscope.

In an optional step, points of interest are identified across (and/or buried in) the sample 106 using at least one of a review tool or a PWG tool. For example, at least some of the buried volumetric field of views 104 may be located at points of interest. However, not all points of interest are necessarily going to cause issues, they may just be areas flagged for further review—akin to a false positive. The points of interest may be identified using such tools (e.g., review tool, PWG tool) by virtue of such tools imaging an anomaly or potential anomaly. An anomaly may be any measurement that was not expected, not desired, and/or above a threshold. For example, an anomaly may be an unexpected value, height discontinuity, and the like on the image that could be a particle/void/defect. Such tools may be at a lower resolution than metrology sub-systems 102 described throughout this disclosure and may need to flag such points of interest of such anomalies for further review.

It should be noted that the scanning of the sample 106 and/or the receiving the plurality of images step (i.e., step 302), and the like may be based on (e.g., informed by) the points of interest described above. For example, the receiving of the plurality of images step may be based on the points of interest. For instance, the points of interest may, in a sense, be the volumetric field of views 104 of the sample 106 to be further inspected.

In an optional step, a set of candidate volumetric field of views are determined. For example, the candidate volumetric field of views (e.g., candidates) may be areas of the sample 106 that, by design, are candidates to be measured for overlay. For example, candidates may be metrology/misalignment targets of one or more layers of a sample such as box-in-box (BiB) metrology targets, AIM metrology targets, and the like.

In one example, some candidate volumetric field of views from the set of candidate volumetric field of views are removed based on the volumetric data to generate a narrowed set of candidate volumetric field of views. For instance, if the volumetric data is used to identify a void overlapping a candidate volumetric field of view, then the overlay target associated with that candidate volumetric field of view may be skipped from being measured in an overlay measurement process. This may increase efficiency by skipping less useful measurements.

In one example, overlay metrology is performed based on the narrowed set of candidate volumetric field of views.

In an optional step, an overlay metrology recipe is improved by generating a performance indicator (e.g., key performance indicator (KPI)) configured to be used to correlate the one or more voids 104 with one or more overlay measurements. For example, certain voids 104 may be correlated with poor/misaligned overlay metrology measurements of metrology targets and some voids 104 may seemingly have no effect/correlation on overlay. For example, a KPI may be a normalized value (e.g., between and including 0.00 to 1.00) that indicates the likelihood that a characteristic (e.g., size, shape, location, and the like) of a void 104 may be used to predict overlay. For instance, a high KPI value may mean that large voids are correlated with (and may cause) large overlay of samples bonded together.

Figure 4:
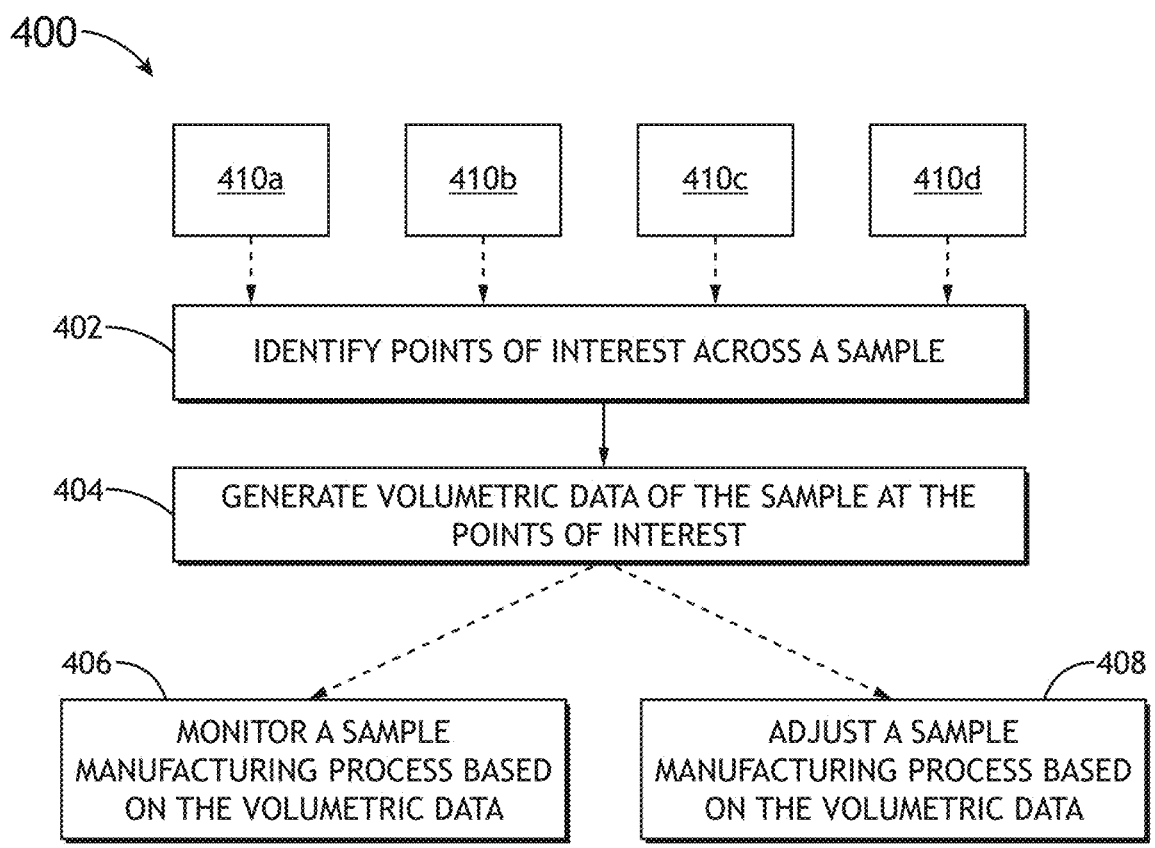
FIG. 4 is a flow diagram illustrating steps performed in a method for generating volumetric data, in accordance with one or more embodiments of the present disclosure.

FIG. 4 is a flow diagram illustrating steps performed in a method 400 for generating volumetric data, in accordance with one or more embodiments of the present disclosure. For example, controller 108 may be configured to be communicatively coupled to the metrology sub-system 102 of the metrology system 100 and may include processors 110 configured to execute program instructions causing the one or more processors 110 to perform the steps of method 400.

In a step 402, points of interest across a sample 106 are identified. In some embodiments, the identification of the points of interest is based on one or more sources 410 (e.g., sources 410a, 410b, 410c, 410d).

For example, the points of interest are based on a user source 410a. For instance, a user (e.g., process engineer) may, based on other sources such as scanning electron microscope (SEM) images, sample designs, or any other source, decide that one or more points of a sample should be further investigated and such points may be deemed the points of interest.

In another example, the points of interest are based on PWG tool measurements 410b. For example, a PWG tool may be pre-configured to identify points of interest based on an algorithm, program, or the like with little to no user input in directly identifying such points of interest based on the user's own judgment.

In another example, the points of interest are based on acoustical microscope tool measurements 410c. For example, an acoustical microscope tool may be pre-configured to identify points of interest based on an algorithm, program, or the like with little to no user input in directly identifying such points of interest based on the user's own judgment.

In another example, the points of interest are based on any other data 410d that may be used for such a purpose.

In a step 404, volumetric data of the sample 106 at the points of interest are generated. For example, any steps (e.g., steps 302 and 304) or the like of the present disclosure may be used to generate such volumetric data.

In some embodiments, at least one of step 406 or step 408 occurs.

At step 406, a sample manufacturing process is monitored based on the volumetric data. For example, the volumetric data may be monitored for breaches beyond a threshold. For example, the volumetric data may be volumetric profiles of overlay targets (e.g., grating targets), where each volumetric data is indicative of an overlay measurement. For example, an overlay measurement may be determined based on the volumetric profile of the overlay target. For instance, a location of the overlay target relative to an anchor reference (e.g., edge of die) or relative to a different overlay target in a lower layer of the sample 106 may be used to determine an overlay measurement based on the volumetric data. Further, multiple overlay measurements may be taken across a sample, across multiple samples, across multiple lots of samples and the like and may be used to monitor, generally, the overlay of the manufacturing process of the samples. A predetermined threshold may be determined based on acceptable overlay measurements and if such a threshold is breached an alert may be sent to a user.

At step 408, a sample manufacturing process is adjusted based on the volumetric data. For example, if a threshold is breached, one or more tools of the manufacturing process may be adjusted (e.g., re-calibrated, re-aligned). In another example, an adjustment may be any other type of adjustment, such as adjusting a film thickness of a sample 106.

Referring again to FIGS. 1B and 1C, embodiments of various components are described in additional detail.

The detectable light 122 may include any type of radiation emanating from the sample 106 and/or reference sample 144. For example, the detectable light 122 may include light or particles. For example, in some embodiments, the detectable light 122 includes measurement beam 168 and/or reference beam 166. For example, the detectable light 122 may include portions of the illumination beam 116 reflected and/or scattered by the sample 106 which may be called or be part of measurement beam 168. By way of another example, the detectable light 122 may include luminescence induced by absorption of the illumination beam 116 by the sample 106. By way of another example, the detectable light 122 may include particles from the sample 106 in response to the illumination beam 116 such as, but not limited to, backscattered electrons or secondary electrons.

The metrology system 100 may include multiple detectors 124 associated with multiple beam paths generated by one or more beamsplitters 136 to facilitate multiple metrology measurements by the metrology system 100. In another embodiment, a detector 124 may include a spectroscopic detector suitable for identifying wavelengths of radiation emanating from the sample 106.

A detector 124 may further be located at any imaging plane of the metrology system 100. For instance, a detector 124 may be located at a plane conjugate to the sample 106 to generate an image of the sample 106. In another instance, a detector 124 may be located at a pupil plane (or a conjugate thereof) to generate a pupil image.

In another embodiment, the metrology sub-system 102 includes a detector 124 configured to capture light emanating from the sample 106 through the collection pathway 120. For example, a detector 124 may receive radiation reflected or scattered (e.g., via specular reflection, diffuse reflection, and the like) from the sample 106. By way of another example, a detector 124 may receive radiation generated by the sample 106 (e.g., luminescence associated with absorption of the illumination beam 116, and the like). By way of another example, a detector 124 may receive one or more diffracted orders of radiation from the sample 106 (e.g., 0-order diffraction, ±1-order diffraction, ±2-order diffraction, and the like).

In another embodiment, the metrology sub-system 102 may include multiple detectors 124 to facilitate multiple metrology measurements by the metrology sub-system 102. In this regard, the metrology sub-system 102 depicted in FIG. 1B may perform multiple simultaneous metrology measurements.

The illumination source 114 may further provide light having any selected temporal characteristics. In one embodiment, the illumination source 114 includes one or more continuous-wave sources to provide a continuous-wave illumination beam 116. In another embodiment, the illumination source 114 includes one or more pulsed sources to provide a pulsed or otherwise modulated illumination beam 116. For example, the illumination source 114 may include one or more mode-locked lasers, one or more Q-switched lasers, or the like.

The illumination source 114 may include any type of light source known in the art but it should be noted that for interferometry types of measurements, the measurement beam 168 is generally coherent (rather than incoherent, out of phase, etc.). For example, in one embodiment, the illumination source 114 includes one or more coherent sources such as, but not limited to, one or more laser sources. In this regard, the illumination source 114 may produce an illumination beam 116 having high coherence (e.g., high spatial coherence and/or temporal coherence). For example, the illumination source 114 may include one or more broadband lasers such as, but not limited to, one or more supercontinuum lasers or white-light lasers. By way of another example, the illumination source 114 may include one or more narrowband lasers. By way of a further example, the illumination source 114 may include one or more tunable lasers to provide an illumination beam 116 having tunable spectral intensity. Further, a coherent illumination source 114 may be based on any type of technology or product design. For example, the illumination source 114 may include, but are not limited to, any combination of one or more fiber lasers, one or more diode lasers, or one or more gas lasers.

It should be noted that the metrology system 100 generally may serve multiple purposes and for at least that reason may be configured to also capture non-interferometric measurements using incoherent illumination. For example, in the same embodiment as above, the illumination source 114 may include one or more low-coherence sources to provide an illumination beam 116 having low or partial coherence (e.g., low spatial and/or temporal coherence). For example, the illumination source 114 may include one or more light emitting diodes (LEDs) or super-luminescence LEDs. By way of another example, the illumination source 114 may include a laser-sustained plasma (LSP) source such as, but not limited to, an LSP lamp, an LSP bulb, or an LSP chamber suitable for containing one or more elements that, when excited by a laser source into a plasma state, may emit broadband illumination. By way of another example, the illumination source 114 may include a lamp source such as, but not limited to, an arc lamp, a discharge lamp, an electrode-less lamp, or the like. Further, the illumination source 114 may include any combination of light sources. In one embodiment, the illumination source 114 includes one or more supercontinuum laser sources to provide broadband illumination and one or more partially-coherent high-brightness LEDs to supplement gaps in the spectrum of the one or more supercontinuum laser sources.

The reference sample 144 may include any sample suitable for providing reference light in the Linnik interferometer. For example, the reference sample 144 may be designed to at least partially replicate the sample 106. In this regard, the Linnik interferometer may be balanced and the optical properties of light propagating through the reference sample 144 may be the same as or substantially similar to those of light propagating through the sample 106.

In one embodiment, the reference sample 144 may be formed from two or more bonded substrates having the same or similar refractive indices as the sample 106 (e.g., according to a metrology recipe/method). Such substrates (e.g., substrates 106a, 106b, 106c) may have varying thicknesses. Further, the reference sample 144 may, but is not required to, include a reflecting layer or coating (e.g., a metallic coating, or the like) at the interface of the two bonded substrates to increase the reflectivity of the interface. In another embodiment, if the sample 106 includes one or more intermediate layers proximate to or forming the buried volumetric field of view 104, the reference sample 144 may include the same or similar layers. Such intermediate layers may be formed as a multi-level wafer, with each layer etched to a specific, potentially different thickness.

In another embodiment, the reference sample 144 is formed as a single substrate, where the bottom surface forms a reference surface. Further, this reference surface may, but is not required to, include a reflecting layer or coating (e.g., a metallic coating, or the like) to increase the reflectivity of the reference surface. Additionally, it is to be understood that the reference sample 144, or any portion thereof, may have any selected thickness based on the application and the properties of the sample 106. For example, in the case of a sample 106 formed from one or more bonded semiconductor wafers, a reference sample 144 may be formed from one or more semiconductor wafers having a thickness (e.g., 775 µm, 750 µm, 600 µm, 300 µm, 100 µm, or the like) of the top wafer 106a of the sample 106. However, such an example is not limiting and the reference sample 144 may be a different thickness than the top wafer 106a of the sample 106.

In one embodiment, when generating volumetric data of a buried volumetric field of view 104 (e.g., inter-sample voids, TSV), a thickness of the reference sample 144 is matched to a thickness of material that is above (along the depth direction) the buried volumetric field of view 104. In this regard, the measurement beam 168 and the reference beam 166 may be configured to have passed through the same (or similar) thickness of material. For example, similar may mean within 5%, within 10% and the like.

In another embodiment, the reference sample 144 includes patterned features at one or more locations (e.g., a back surface of a single reference substrate or an interface between bonded substrates) to facilitate alignment of the reference sample 144.

Note that the phrase "according to a metrology recipe", according to a recipe, pursuant to a recipe, and the like may mean that a metrology system 100 is configured to be compatible with a recipe, programmed according to a recipe, and/or the like. A recipe may be a plan, procedure, method, program instructions, and/or the like. Further, a sample and the like may not necessarily be part of a metrology system 100 according to a metrology recipe, rather the metrology system 100 may be configured to be compatible with and/or configured for such a sample. For example, "according to a metrology recipe" may mean according to what the metrology system 100 and/or program instructions are configured for.

Referring again to FIG. 1A, embodiments of various components are described in additional detail.

As noted previously herein, the controller 108 of metrology system 100 may include one or more processors 110 and memory 112. The memory 112 may include program instructions configured to cause the one or more processors 110 to carry out various steps of the present disclosure.

In another embodiment, the display of the user interface may be configured to display data of metrology system 100 to a user.

As noted previously herein, the one or more processors 110 of the controller 108 may be communicatively coupled to memory 112, where the one or more processors 110 may be configured to execute a set of program instructions maintained in memory 112, and the set of program instructions may be configured to cause the one or more processors 110 to carry out various functions and steps of the present disclosure.

It is noted herein that the one or more components of metrology system 100 may be communicatively coupled to the various other components of metrology system 100 in any manner known in the art. For example, the one or more processors 110 may be communicatively coupled to each other and other components via a wireline (e.g., copper wire, fiber optic cable, and the like) or wireless connection (e.g., RF coupling, IR coupling, WiMax, Bluetooth, 3G, 4G, 4G LTE, 5G, and the like). By way of another example, the controller 108 may be communicatively coupled to one or more components of metrology system 100 via any wireline or wireless connection known in the art.

In one embodiment, the one or more processors 110 may include any one or more processing elements known in the art. In this sense, the one or more processors 110 may include any microprocessor-type device configured to execute software algorithms and/or instructions. In one embodiment, the one or more processors 110 may consist of a desktop computer, mainframe computer system, workstation, image computer, parallel processor, or other computer system (e.g., networked computer) configured to execute a program configured to operate the metrology system 100, as described throughout the present disclosure. It should be recognized that the steps described throughout the present disclosure may be carried out by a single computer system or, alternatively, multiple computer systems. Furthermore, it should be recognized that the steps described throughout the present disclosure may be carried out on any one or more of the one or more processors 110. In general, the term "processor" may be broadly defined to encompass any device having one or more processing elements, which execute program instructions from memory 112. Moreover, different subsystems of the metrology system 100 (e.g., metrology sub-system 102, interferometer, controller 108, user interface, and the like) may include processor or logic elements suitable for carrying out at least a portion of the steps described throughout the present disclosure. Therefore, the above description should not be interpreted as a limitation on the present disclosure but merely an illustration.

The memory 112 may include any storage medium known in the art suitable for storing program instructions executable by the associated one or more processors 110 and the data received from the metrology system 100. For example, the memory 112 may include a non-transitory memory medium. For instance, the memory 112 may include, but is not limited to, ROM, RAM, a magnetic or optical memory (e.g., disk), a magnetic tape, a solid-state drive and the like. It is further noted that the memory 112 may be housed in a common controller housing with the one or more processors 110. In an alternative embodiment, the memory 112 may be located remotely with respect to the physical location of the processors 110, controller 108, and the like. In another embodiment, the memory 112 maintains program instructions for causing the one or more processors 110 to carry out the various steps described through the present disclosure.

In one embodiment, the user interface is communicatively coupled to the controller 108. The user interface may include, but is not limited to, one or more desktops, tablets, smartphones, smart watches, or the like. In another embodiment, the user interface includes a display used to display data of the metrology system 100 to a user. The display of the user interface may include any display known in the art. For example, the display may include, but is not limited to, a liquid crystal display (LCD), an organic light-emitting diode (OLED) based display, or a CRT display. Those skilled in the art should recognize that any display device capable of integration with a user interface is suitable for implementation in the present disclosure. In another embodiment, a user may input selections and/or instructions responsive to data displayed to the user via a user input device of the user interface.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be RAM, and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A metrology system comprising:
a metrology sub-system comprising:
a detector configured for multi-pixel imaging;
an illumination source configured to generate an illumination beam;
a beamsplitter configured to split the illumination beam into a measurement beam propagating in a measurement arm and a reference beam propagating in a reference arm, wherein the illumination beam includes a first spectral range of illumination partially overlapping a second spectral range of illumination, wherein the beamsplitter includes a wavelength filter beamsplitter such that the reference beam includes the first spectral range of illumination and the measurement beam includes the second spectral range of illumination;
a measurement objective lens configured to direct the measurement beam to a sample;
one or more illumination optics configured to illuminate a volumetric field of view of the sample with the measurement beam through the measurement objective lens; and
a reference objective lens configured to direct the reference beam to a reference sample; and
wherein the metrology sub-system is configured to, according to a metrology recipe, image the volumetric field of view of the sample on the detector based on interference of the measurement beam with the reference beam,
a controller communicatively coupled to the detector, wherein the controller includes one or more processors configured to execute program instructions causing the one or more processors to:
receive a plurality of images from a scan of the sample at a plurality of focal planes located along a depth direction of the sample to generate, via the detector of the metrology sub-system, the plurality of images of the volumetric field of view of the sample at the plurality of focal planes; and
aggregate the plurality of images to generate volumetric data of the volumetric field of view of the sample.

2. The metrology system of claim 1, wherein the sample is formed from a first substrate and a second substrate, the second substrate bonded to the first substrate at an interface, wherein the volumetric field of view is located within the sample.

3. The metrology system of claim 2, wherein the metrology sub-system comprises a Linnik interferometer.

4. The metrology system of claim 3, wherein the Linnik interferometer comprises an infrared interferometer.

5. The metrology system of claim 3, wherein the Linnik interferometer comprises a short-wave infrared (SWIR) interferometer.

6. The metrology system of claim 2, wherein the program instructions are further configured to identify one or more voids of the volumetric field of view of the sample based on the volumetric data, wherein the one or more voids are located at the interface.

7. The metrology system of claim 2, wherein the program instructions are further configured to determine a characteristic of one or more voids of the volumetric field of view of the sample based on the volumetric data, wherein the one or more voids are located at the interface.

8. The metrology system of claim 2, wherein the sample comprises a die-to-wafer (D2W) bonded sample, according to the metrology recipe.

9. The metrology system of claim 2, wherein the sample comprises a die-to-die (D2D) bonded sample, according to the metrology recipe.

10. The metrology system of claim 2, wherein the sample comprises a wafer-to-wafer (W2W) bonded sample, according to the metrology recipe.

11. The metrology system of claim 1, wherein the volumetric field of view of the sample comprises a volumetric field of view of a surface shape of the sample, and the sample is in a pre-bonded state according to the metrology recipe.

12. The metrology system of claim 11, wherein the volumetric data comprises a height map of the surface shape of the sample.

13. The metrology system of claim 11, wherein the metrology sub-system comprises a Linnik interferometer.

14. The metrology system of claim 13, wherein the detector is configured to operate in a visible spectral range of light.

15. The metrology system of claim 13, wherein the Linnik interferometer is configured to operate in an infrared spectral range of light.

16. The metrology system of claim 13, wherein the Linnik interferometer is configured to operate in a short-wave infrared (SWIR) spectral range of light.

17. The metrology system of claim 1, wherein the volumetric field of view of the sample comprises a volumetric field of view of a through-silicon via (TSV) of the sample.

18. The metrology system of claim 1, wherein the volumetric field of view of the sample comprises a volumetric field of view of an overlay target of the sample.

19. The metrology system of claim 1, wherein the receive the plurality of images from the scan of the sample at the plurality of focal planes comprises at least one of:
    moving the sample via a translation stage;
    moving the reference sample via a reference translation stage; or
    adjusting a phase of the reference beam of the reference arm.

20. The metrology system of claim 1, wherein the metrology system further comprises a photodiode, the photodiode configured to focus the detector.

21. The metrology system of claim 20, wherein the photodiode is configured to receive photodiode beam from the beamsplitter associated with the interference of the measurement beam with the reference beam, wherein the photodiode is configured to generate sample positioning data.

22. The metrology system of claim 21, wherein the photodiode beam originates from the illumination beam from the illumination source, and from a second illumination beam from a second illumination source.

23. The metrology system of claim 21, wherein the metrology sub-system further comprises a modulator configured to modulate the photodiode beam directed to the photodiode, the modulator comprising at least one of:
    a binary phase filter (BPF);
    a full width, half-maximum (FWHM) filter; or
    an annular mask.

24. The metrology system of claim 21, wherein the metrology sub-system further comprises a modulator configured to modulate the photodiode beam directed to the photodiode, the modulator comprising a binary phase filter (BPF), a full width, half-maximum (FWHM) filter, and an annular mask.

25. The metrology system of claim 1, wherein the measurement beam that is directed to the sample is larger in area, as viewed in a focal plane of the plurality of focal planes, than the volumetric field of view of the sample, and wherein the plurality of images comprises an imaged area larger than the volumetric field of view of the sample.

26. The metrology system of claim 1, wherein the metrology system further comprises at least one of a review tool or a patterned wafer geometry (PWG) tool, the PWG tool configured to image all of a surface of the sample at once,
    wherein the program instructions are further configured to, before the receive the plurality of images, identify points of interest across the sample,
    wherein the receive the plurality of images is based on the points of interest.

27. The metrology system of claim 26,
    wherein the identify the points of interest is performed using the at least one of the review tool or the patterned wafer geometry (PWG) tool.

28. The metrology system of claim 27, wherein the review tool is an acoustical microscope.

29. The metrology system of claim 26, wherein the identify the points of interest is based on user input.

30. The metrology system of claim 26, wherein the program instructions are further configured to monitor a sample manufacturing process based on the volumetric data.

31. The metrology system of claim 26, wherein the program instructions are further configured to adjust a sample manufacturing process based on the volumetric data.

32. The metrology system of claim 1, wherein the illumination beam includes an annular illumination beam.

33. The metrology system of claim 1, wherein the illumination beam is shifted across a pupil plane of the metrology sub-system.

34. A method comprising:
    scanning a sample at a plurality of focal planes located along a depth direction of the sample to generate, via a detector of a metrology sub-system, a plurality of images of a volumetric field of view of the sample at the plurality of focal planes, wherein the detector comprises a multi-pixel detector; and
    aggregating the plurality of images to generate volumetric data of the volumetric field of view of the sample,
    the metrology sub-system comprising a Linnik interferometer, wherein metrology sub-system is configured to generate an illumination beam including a first spectral range of illumination partially overlapping a second spectral range of illumination, wherein a beamsplitter includes a wavelength filter beamsplitter such that the reference beam includes the first spectral range of illumination and the measurement beam includes the second spectral range of illumination.

35. The method of claim 34, wherein the Linnik interferometer comprises an infrared interferometer.

36. The method of claim 34, wherein the Linnik interferometer comprises a short-wave infrared (SWIR) interferometer.

37. The method of claim 34, further comprising identifying one or more voids based on the volumetric data.

38. The method of claim 37, further comprising: determining a set of candidate volumetric field of views of the sample; removing candidate volumetric field of views from the set of candidate volumetric field of views based on the volumetric data to generate a narrowed set of candidate volumetric field of views; and performing overlay metrology based on the narrowed set of candidate volumetric field of views.

39. The method of claim 37, further comprising improving an overlay metrology recipe by:
generating a performance indicator configured to correlate the one or more voids with overlay measurements.

40. The method of claim 34, further comprising determining a characteristic of one or more voids based on the volumetric data.

41. The method of claim 34, wherein the volumetric field of view of the sample comprises a volumetric field of view of a through-silicon via (TSV) of the sample.

42. The method of claim 34, wherein the volumetric field of view of the sample comprises a volumetric field of view of an overlay target of the sample.

43. The method of claim 34, the scanning of the sample at the plurality of focal planes comprising at least one of:
moving the sample via a translation stage;
moving a reference sample via a reference translation stage; or
adjusting a phase of a reference beam of a reference arm.

44. The method of claim 34, the metrology sub-system comprising a photodiode, the photodiode configured to focus the detector.

45. The method of claim 44, wherein the photodiode is configured to receive photodiode beam from a beamsplitter associated with interference of a measurement beam in a measurement arm with a reference beam from a reference arm, wherein the photodiode generates sample positioning data.

46. The method of claim 45, wherein the photodiode beam originates from the illumination beam from an illumination source, and from a second illumination beam from a second illumination source.

47. The method of claim 45, further comprising modulating, via a modulator, the photodiode beam directed to the photodiode, wherein the modulator comprises at least one of:
a binary phase filter (BPF);
a full width, half-maximum (FWHM) filter; or
an annular mask.

48. The method of claim 45, further comprising modulating, via a modulator, the photodiode beam directed to the photodiode, wherein the modulator comprises a binary phase filter (BPF), a full width, half-maximum (FWHM) filter, and an annular mask.

49. The method of claim 34, wherein the volumetric field of view is entirely contained within a cross-sectional area of a measurement beam that is directed to the sample such that the volumetric field of view is fully illuminated.

50. The method of claim 34, further comprising, before the scanning, identifying points of interest across the sample,
wherein the scanning the sample to generate the plurality of images is based on the points of interest.

51. The method of claim 50, wherein the identifying the points of interest is performed via at least one of a review tool or a patterned wafer geometry (PWG) tool, the PWG tool configured to image all of a surface of the sample at once.

52. The method of claim 51, wherein the review tool is an acoustical microscope.

53. The method of claim 50, wherein the identifying the points of interest is based on user input.

54. The method of claim 50 further comprising monitoring a sample manufacturing process based on the volumetric data.

55. The method of claim 50 further comprising adjusting a sample manufacturing process based on the volumetric data.

* * * * *